United States Patent [19]

Buynoski

[11] Patent Number: 4,999,309

[45] Date of Patent: Mar. 12, 1991

[54] ALUMINUM-IMPLANT LEAKAGE REDUCTION

[75] Inventor: Matthew S. Buynoski, Palo Alto, Calif.

[73] Assignee: National Semiconductor Corporation, Santa Clara, Calif.

[21] Appl. No.: 553,218

[22] Filed: Jul. 12, 1990

[51] Int. Cl.$^5$ .............................................. H01L 21/04
[52] U.S. Cl. ........................................ 437/15; 437/20; 437/27; 437/31; 437/143; 437/157; 437/98.6
[58] Field of Search ................. 437/15, 27, 904, 26, 437/986, 157; 357/14, 13; 148/DIG. 44, DIG. 33, DIG. 31

[56] References Cited

U.S. PATENT DOCUMENTS

| | | | |
|---|---|---|---|
| 4,397,887 | 8/1983 | Aytac | 437/986 |
| 4,910,160 | 3/1990 | Jennings | 437/31 |
| 4,940,671 | 7/1990 | Small | 437/31 |

*Primary Examiner*—Brian E. Hearn
*Assistant Examiner*—Kevin M. Picardat
*Attorney, Agent, or Firm*—Gail W. Woodward; Lee Patch; Michael A. Glenn

[57] ABSTRACT

An improved process is described for the formation of PNP transistor collector base junctions or PN junction capaciters in silicon monolithic integrated circuits that employ the ion implantation and diffusion of aluminum in these regions that are to contain high performance PNP transistors or capacitors. The process reduces or eliminates the leakage typically found in such devices.

7 Claims, 1 Drawing Sheet

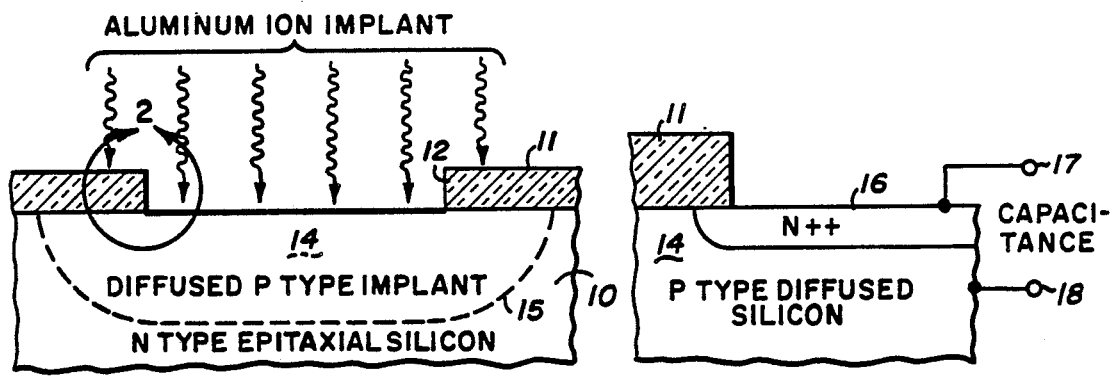
Fig_1 (PRIOR ART)    Fig_2 (PRIOR ART)
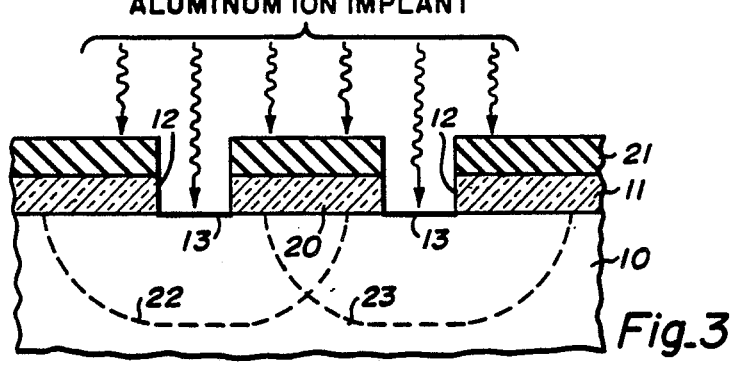
Fig_3
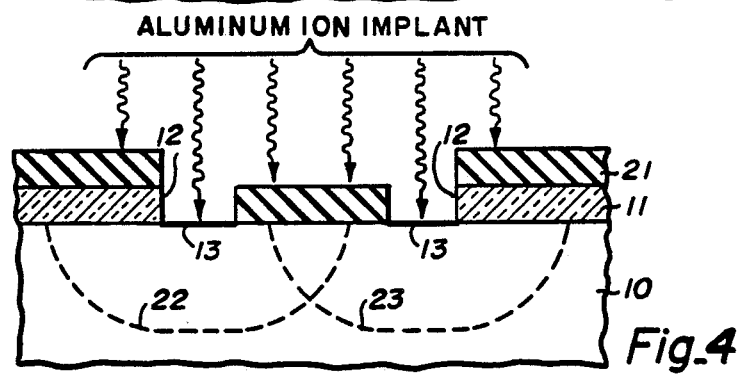
Fig_4
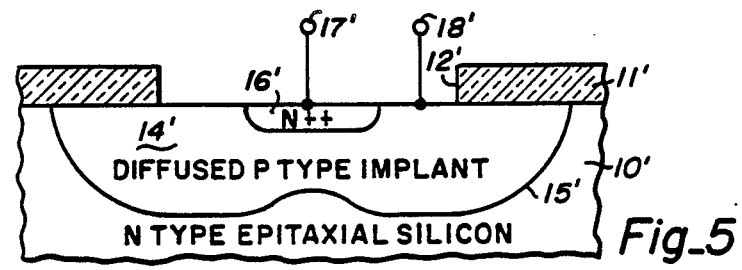
Fig_5
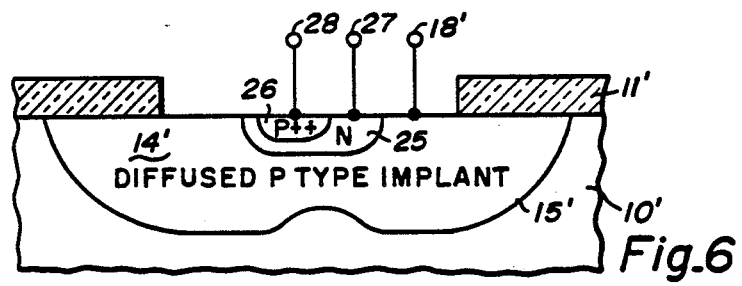
Fig_6

ALUMINUM-IMPLANT LEAKAGE REDUCTION

BACKGROUND OF THE INVENTION

In the fabrication of PNP transistors in silicon integrated circuits, it is known to implant aluminum into an N-type silicon substrate and to diffuse the aluminum into the substrate to create a P well in the silicon. Aluminum is chosen because it rapidly diffuses into silicon and is a P type dopant that can convert the N type substrate to P type.

The doping in the P well is adjusted to determine the collector characteristics for the PNP transistor that will be created therein. The PNP transistor is completed by diffusing an N type base layer into the P well and a P+ emitter region is then diffused within the N type base. Thus, a double diffused transistor is produced having the conventional vertical construction of a planar structure.

Conventional vertical planar NPN transistors are created in the N type silicon substrate to provide complementary transistors. When the NPN and PNP transistors are produced in a silicon epitaxial layer they can be isolated using the conventional well-known PN junction isolation process and they can be interconnected into a conventional monolithic integrated circuit.

The creation of such transistors is described in my copending patent application Ser. No. 853,530, now 4940671 which was filed Apr. 18, 1986, and is assigned to the assignee of the present invention. This patent application is titled A High Voltage Complementary NPN/PNP Process and was coinvented with J. Barry Small. In a further development, which was coinvented with Dean C. Jennings U.S. Pat. No. 4,910,160 issued on Mar. 20, 1990 to the assignee of the present invention. This patent is titled Complementary PNP/NPN Power Transistor Process. The above application and patent both teach the ion implantation of aluminum into N type epitaxial silicon where the aluminum is diffused a substantial distance into the silicon. The teachings in the application and patent are incorporated herein by reference.

While not taught in the above references, the IC devices being produced often require capacitors as circuit elements. Capacitors can be created using reverse biased PN junctions. For example, a junction can be created by diffusing a heavily doped N++ layer into the silicon P well to create an abrupt PN junction. When reverse biased such a junction can display substantial capacitance per unit area. An even higher capacitance can be realized by preceding the N+ layer with a layer of P+ material having lower resistivity than the P well itself. However, it has been discovered that such capacitors may have high leakage currents when fabricated into aluminum implanted silicon. Furthermore, this leakage tends to grow worse with time.

SUMMARY OF THE INVENTION

It is an object of the invention to provide PN junctions in ion implanted aluminum doped silicon in which the reverse biased leakage is minimized.

It is a further object of the invention to provide a process in which the aluminum ion implant is eliminated in the region where IC capacitors and PNP transistors are to be located thereby avoiding PN junction leakage in the subsequently produced junctions.

These and other objects are produced as follows. In the production of IC transistors one of the process steps includes the masked implant of aluminum into those regions of N type silicon where PNP transistors are to be fabricated. The aluminum is implanted and then diffused to create a P well in the N type silicon. The P well doping is adjusted to provide the background doping of the PNP transistor collector. In a PNP transistor the base is N type and usually is doped with phosphorus. The PNP transistor is completed by diffusing a heavily doped P++ emitter inside the confines of the N type base and to a lesser depth. Thus the emitter doping overpowers the base doping and leaves a thin graded base between the emitter and collector.

The aluminum implant is normally achieved by way of an implant mask that has openings located where the P well is desired. The mask, which is thick enough to resist the implant ions, is produced photolithographically by etching the silicon oxide using organic masking materials in the well-known manner. In accordance with the invention masking material is retained in the ion implant mask, inside the region that is ordinarily ion implanted, where PN junction capacitors and PNP transistor emitter base diodes are to be subsequently fabricated. The retained mask portions can be in the form of the organic mask material applied directly to the silicon surface or it can be formed from a silicon oxide remnant created from the oxide that ordinarily is used as a transistor base diffusion mask. In either case, the aluminum implant is avoided in those regions where the PNP transistors or capacitors are to be subsequently created. Then, when aluminum is implanted, it does not directly impinge silicon in the capacitor or PNP transistor base regions. However, since the aluminum is subsequently diffused into the silicon to a substantial depth, its lateral diffusion will penetrate under the retained mask so as to effectively dope the silicon under the entire area of the PNP transistor or capacitor.

Then, the implant mask, and/or the masking oxide, is removed and the heavily doped N+ region located in the region formerly masked. I have discovered that the resultant PNP transistor or capacitor functions normally in the intended manner. When the PN junction diode is reverse biased it shows no prebreakdown leakage and a high grade PNP transistor or capacitor exists. I have concluded that the leakage that appears in the prior art structures is due to the inclusion of aluminum, probably in the form of oxide precipitates that are present, in the semiconductor region that underlies the junction. The oxide-containing aluminum piles up on the semiconductor surface and is driven into the silicon by the ion bombardment. The resultant strains in the silicon can adversely affect the planar PN junction. Apparently, the silicon is stressed in the vicinity of the junction and reverse biased leakage develops.

BRIEF DESCRIPTION OF THE DRAWING

FIG. 1 is a fragment of a silicon wafer showing an oxide masked aluminum ion implant as practiced in the prior art.

FIG. 2 shows a portion of a silicon wafer in which a PN junction is created in an aluminum diffused silicon substrate fabricated in accordance with FIG. 1.

FIG. 3 is a fragment of a silicon wafer shown being aluminum ion implanted in accordance with the invention.

FIG. 4 is a fragment of a silicon wafer shown being aluminum ion implanted in accordance with an alternative embodiment of the invention.

FIG. 5 is a fragment of a silicon wafer showing a capacitor fabricated in the silicon produced by the FIG. 3 or FIG. 4 ion implants.

FIG. 6 is a fragment of a silicon wafer showing a PNP transistor fabricated in the silicon produced by the FIG. 3 or FIG. 4 ion implants.

DESCRIPTION OF THE PRIOR ART

In FIG. 1 a silicon substrate 10 represents a fragment of a silicon wafer that is being treated to produce monolithic integrated circuits. Substrate 10 represents an N type epitaxial layer that is typically deposited upon a P type substrate wafer (not shown). In accordance with conventional planar processing an oxide layer 11, typically about 8 KA thick, is established on the silicon surface. A hole is created at 12 in the oxide by conventional photolithographic etching and aluminum ions implanted into the wafer at 13. For example, about $1 \times 10^{13}$ to $3 \times 10^{14}$ aluminum atoms per square centimeter can be deposited at an energy of about 180 KeV. The dose is selected to provide the doping required by the process being implemented. The energy is selected to ensure that the bulk of the aluminum ions penetrate into the silicon to a desired depth. As shown at 13 aluminum atoms are implanted into the silicon only inside oxide hole 12 and the oxide masks the silicon elsewhere.

After the implant the wafer is heated typically to about 1150° C. and the aluminum diffused into the silicon. As is well known, at such a temperature, aluminum will diffuse rapidly to a substantial depth. After about 70 to 90 minutes the aluminum will diffuse into and dominate region 14. A PN junction then exists at dashed line 15. Thus, above dashed line 15 the silicon will be doped P type and below dashed line 15 it will be N type.

FIG. 2 shows an enlarged portion of the wafer at the region designated as a circle 2 in FIG. 1. Here an N++, or heavily doped, region 16 is shown extending into the P type material 14. Such a region can be created during the fabrication of an NPN transistor emitter. Region 16 is relatively thin as well as heavily doped. Thus a shallow planar PN junction is created. Such junction can form capacitors in an IC. As shown schematically by terminals 17 and 18 contacts can be made to regions 16 and 14 respectively. In practice, these contacts will be achieved by way of conventional planar metallization. When the junction shown is either close to zero or reverse biased it can display substantial capacitance per unit area.

While not shown, the silicon that underlies region 16 can be more heavily doped P type by means of a diffusion that surround region 16 and extends more deeply into the silicon. Such a structure can be created using both the emitter and base diffusions of the NPN transistors. This will increase the capacitance per unit area when desired. In such a case terminal 18 will be connected to the more heavily doped P type material.

Thus, FIG. 2 illustrates how a useful IC capacitor can be fabricated into a chip. However, it has been discovered that when such capacitors are fabricated into implanted and diffused aluminum doped silicon they display reverse bias current leakage. Furthermore, such leakage tends to grow with time. Leakage current represents a resistor in shunt with the capacitance and can adversely affect the performance of an IC. Accordingly, the elimination of such leakage would be desirable.

DESCRIPTION OF THE INVENTION

FIG. 3 is a silicon wafer fragment being processed in accordance with the invention. N type substrate 10 has an oxide 11 with its photolithographically etched hole 12. However, a portion of the oxide at 20 is retained inside hole 12. While not shown, this hole can be of any desired shape. Its periphery is large enough to encompass the device that is to be constructed within. Accordingly, the silicon surface is expressed in the shape of a ring. Layer 21 represents the resist used in the photolithoraphic process employed in oxide 11 etching. This resist can be left in place to assist in the aluminum ion implant masking. However, in the FIG. 3 process the resist can be removed, if desired and the oxide alone employed to mask the implant. In any event, a mask 20 is retained in the center of hole 12 and it will prevent aluminum from directly impinging the silicon in the center of hole 12. Thus, the implant forms a ring 13 of implanted aluminum doped material. Then, the resist is removed and the wafer subjected to the high temperature diffusion. This creates an aluminum diffusion shown by dashed lines 22 and 23. As an important condition these lines overlap, as shown, so that as the aluminum diffuses into the silicon it will diffuse laterally so that all of the silicon under the remnant of oxide mask 20 will be doped.

FIG. 4 shows an alternative embodiment of the invention. Here the oxide 20 shown in FIG. 3 has been removed and an equivalent portion of mask 21 retained to prevent the aluminum ions from striking the silicon in the center of hole 12. The result is the same as that which occurred for FIG. 3. Diffusion extent dashed lines 22 and 23 overlap in the center of hole 12.

It is to be understood that while FIG. 3 shows a full thickness central oxide remnant 20 and FIG. 4 shows zero central oxide, the photoresist implant mask can be composed of any thickness oxide so long as the oxide plus resist thickness is adequate to resist the implant. Where a thin oxide or none is employed, the photoresist mask must be retained during implant and thick enough to preclude any ion implant in the central region. In practice, it is considered desirable to employ at least some oxide because photoresists are difficult to adhere directly to bare silicon.

After the implants of either FIG. 3 or FIG. 4 (or some intermediate therebetween), the resist 21 is removed and the wafer subjected to the high temperature diffusion. This creates a P type region 14' and a PN junction as shown by line 15' in FIG. 5. Then, the N++ junction forming diffusion for a capacitor is localized as shown at 16' in the center of ring 12. It can be seen that the capacitance-forming PN junction is present in silicon that was not ion bombarded. Such junctions do not display the reverse biased leakage described in connection with the structure of FIG. 2.

FIG. 6, which is similar to FIG. 5, shows the formation of a PNP transistor in the central portion of diffused region 14'. Here an N type base 25 is diffused using photolithography and the conventional planer process. Base region 25 is typically about two microns deep. Then a heavily doped, or P++, emitter 26 is created within the confines of base 25. Under normal conditions contact 18' is the collector contact 27 is the base and contact 28 is the emitter. These contacts, while shown in schematic form, are made using the conventional planar metallization process. The PN junction that exists between regions 25 and 26 can, when at zero or reverse bias, provide a capacitance between terminals 27 and 28. Also, the PN junction that exists between regions 14' and 25 can, when at zero or reverse bias, provide a capacitance between terminals 18' and 27. Furthermore, these capacitances can be paralleled for the maximum capacitance value.

In the structure of FIG. 6, it can be seen that where the PNP transistor or the PN junction capacitors exist, the silicon surface was not subjected to ion bombardment. Thus, the transistor and/or capacitor elements are not subject to the above described reverse bias leakage associated with the prior art.

The invention has been described and its implementation set forth in detail. When a person of ordinary skill in the art reads the foregoing description, alternatives and equivalents, within the spirit and intent of the invention, will be apparent. Accordingly, it is intended that the scope of the invention be limited only by the claims that follow.

I claim:

1. In a process for forming a PN junction device, which is to be created in a silicon monolithic integrated circuit in which aluminum is ion implanted and diffused to a substantial depth, the steps comprising:
    forming an ion implant mask over said silicon in the region where a PN junction device is to be formed;
    forming an opening in said mask surrounding said region where said device is to be formed;
    ion implanting aluminum into said silicon wherein said mask prevents ion implantation except in those areas where said opening exists;
    diffusing said implanted aluminum in high temperature to drive said aluminum to a substantial depth in said silicon wherein said aluminum diffuses laterally underneath said mask that exist over said region where said device is to be formed; and
    forming a relatively shallow and heavily doped N type region in said region where said PN junction device is to be formed.

2. The process steps of claim 1 wherein prior to said relatively shallow and heavily doped N type region formation, a relatively heavily doped P type region is formed to have an area and depth that exceeds that of said N type region whereby capacitance is enhanced.

3. The process steps of claim 1 wherein said N type region is doped with phosphorous.

4. The process steps of claim 2 wherein said relatively heavily doped P type region is doped with boron.

5. The process steps of claim 1 wherein said forming an ion implant mask involves the steps of:
    forming an oxide layer over said silicon having a thickness that will prevent the aluminum ions from entering the silicon in the ion implanting step;
    forming an etch resistant mask on said oxide having openings that are located where ion implanting is desired; and
    etching said oxide away inside said openings.

6. The process steps of claim 5 further including the step of removing said etch resistant mask prior to said ion implanting step.

7. The process steps of claim 5 wherein said etch resistant mask is made sufficiently thick to prevent ion implanted aluminum from passing therethrough and said etch resistant mask is left in place during said ion implanting step.

* * * * *